United States Patent [19]
Pichon

[11] 4,080,829
[45] Mar. 28, 1978

[54] APPARATUS FOR AUTOMATICALLY MEASURING THE RESISTANCE AND HEATING UP OF RESISTIVE ELECTRICAL COMPONENTS

[75] Inventor: Michel Pichon, Fontenay-sous-Bois, France

[73] Assignee: Compagnie Internationale pour l'Informatique Cii-Honeywell Bull, Paris, France

[21] Appl. No.: 776,615

[22] Filed: Mar. 11, 1977

[30] Foreign Application Priority Data

Mar. 17, 1976 France .................................. 76 07741

[51] Int. Cl.² .......................... G01K 7/24; G05F 3/10
[52] U.S. Cl. ............................. 73/362 AR; 323/75 A; 323/75 B
[58] Field of Search ....................... 73/362 AR, 362.5; 323/75 A, 75 B

[56] References Cited
U.S. PATENT DOCUMENTS

| 2,478,000 | 8/1949 | Miller | 323/75 A X |
| 2,982,908 | 5/1961 | Erickson et al. | 73/362.5 X |
| 3,429,183 | 2/1969 | Lindberg | 73/362 AR |

Primary Examiner—Richard C. Queisser
Assistant Examiner—John S. Appleman
Attorney, Agent, or Firm—Cameron, Kerkam, Sutton, Stowell & Stowell

[57] ABSTRACT

An apparatus is described for automatically measuring the resistance and heating up of resistive electrical components, such as the windings of transformers or the coils of motors. The apparatus comprises a bridge circuit fed by a source of D.C. voltage and includes a voltage detector and switching means, the latter enabling the voltage detector to be connected across various points of the bridge circuit so as to produce virtually simultaneous measurements of the heating up of the component under test and of the ambient temperature at the place where the tests and measurements are being preformed.

3 Claims, 2 Drawing Figures

APPARATUS FOR AUTOMATICALLY MEASURING THE RESISTANCE AND HEATING UP OF RESISTIVE ELECTRICAL COMPONENTS

BACKGROUND OF THE INVENTION

The present invention relates to an apparatus for automatically measuring the resistance and heating up of resistive electrical components.

It relates more particularly to measuring the resistance and heating up of the windings of transformers or the coils of motors. It also enables an indication to be given of the ambient temperature at the place where these various measurements are made.

Apparatus is known which enables measurements to be made, on the one hand, of the resistance of a resistive electrical component (e.g. a winding) and, on the other hand, of the heating up to which this winding is subject when it is for example subjected to operating tests. Apparatus which enables the resistance and heating up of a component to be measured is generally formed by a Wheatstone bridge whose arms contain variable resistors which have to be adjusted each time a measurement is made, so as to balance the bridge. Once the bridge is balanced, it is then necessary, from the value to which one of the resistors has been adjusted either to calculate the temperature of the component contained in one of the arms of the bridge, or to calculate the value of the resistance of this component, after the bridge has been rebalanced. These adjustments are time consuming and require care and they result in a considerable disadvantage. Because the time required to perform the balancing operation is fairly long, a component whose temperature is to be measured after an operating test cools down to a considerable extent and the amount of heating up calculated on the basis of balancing the bridge is less than the actual heating up which the component has experienced at the end of the test.

Furthermore, if the ambient temperature at the place where the tests are being conducted varies, it is necessary to be able to detect these variations very quickly, indeed virtually at the same time as the measurements of the heating up of the components are carried out. There is no known apparatus which enables highly accurate measurements to be made of variations in ambient temperature, virtually at the same time as measurements of the heating up of the components and using the same apparatus.

One object of the invention is to provide an apparatus for automatically measuring the heating up and resistance of resistive electrical components which enables these drawbacks to be substantially reduced or overcome, and in particular enables difficult and time consuming adjustments to be avoided the effect of which is that the heating up measured is less than the actual heating up of the component at the end of the test.

Another object of the invention is to enable virtually simultaneous measurements to be made of the heating up of the component and of the ambient temperature at the place where the tests and measurements are being performed. Finally, the invention avoids the necessity of rebalancing the bridge, each time the heating up of a component is to be measured.

SUMMARY OF THE INVENTION

In accordance with the invention, an apparatus for automatically measuring the heating up and resistance of resistive electrical components comprises a bridge circuit which is fed by a source of DC voltage, wherein said bridge circuit comprises:

a first arm connected to the terminals of the voltage source and which is formed by two resistors of fixed values connected in series, a second arm connected to the terminals of the voltage source and formed by a resistor sensitive to variations in ambient temperature which is connected in series with a combination comprising a first variable resistor connectable in parallel with a second variable resistor, a third arm connected to the terminals of the voltage source and formed by a variable resistor connectable in series with the resistive component whose resistance and heating up are to be measured, a voltage detector which is connectable, on the one hand, between the common points of the series resistors in the first and second arms and, on the other hand, between the common points of the series resistors in the second and third arms, first switching means which enable the voltage detector to be connected between the common points of the resistors in the first and second arms and which enable a first level E1 of supply voltage to be applied to the bridge so that, after the first resistor in the combination in the second arm has been adjusted, the voltage detector will indicate the difference between ambient temperature and a reference temperature.

second switching means which enable the voltage detector to be connected between the common points of the resistors in the first and second arms, which enable a second level E2 of supply voltage to be applied to the bridge, and which enable the second resistor in the combination in the second arm to be connected in parallel with the first resistor in this combination so that, after the second resistor has been adjusted, the voltage detector will indicate the ambient temperature at the sensitive resistor, third switching means which enable the voltage detector to be connected between the common points of the series resistors in the second and third arms, which enable the variable resistor in the third arm to be connected in series with the resistance to be measured, and which enable the first voltage level E1 to be fed to the bridge, so that when the bridge is balanced, the value of the variable resistor is a multiple of the value of the resistance of the component to be measured and the voltage detector will then indicate the difference between the temperature of the component and the ambient temperature at the sensitive resistor.

Thus, this apparatus enables measurements to be made of ambient temperature at the place where the heating up tests are being carried out on the component, and will also indicate the difference between the temperature of the component and the ambient temperature, i.e. the heating up of the component. Finally, the apparatus will indicate the difference between ambient temperature and a reference temperature, as well as the value of the resistance referred to the reference temperature. This reference temperature is generally equal to 20° C for tests on electrical components.

In accordance with a special feature of the invention, the first level E1 of the supply voltage is given by the equation:

$$E1 = 10^n \cdot \left[ \frac{1}{\alpha o} \cdot \frac{(ko + 1)^2}{ko} \right]$$

whilst the second level E2 of supply voltage is given by the equation:

$$E2 = 10^n \cdot \left[ \frac{1}{\alpha'o} \cdot \frac{(k'o + 1)^2}{k'o} \right]$$

In these equations $n$ is an integer depending upon the units of measurement of the voltage detector, $\alpha\ o$ is the temperature coefficient of the sensitive resistor at 0° C, $ko$ is the ratio between the values of the resistors in the second arm at 0° C, $\alpha'o$ is the temperature coefficient of the sensitive resistor at a reference temperature at which the tests on the components are generally performed, $k'o$ is the ratio between the resistors in the second arm at the reference temperature.

BRIEF DESCRIPTION OF THE DRAWINGS

Other features and advantages of the invention will be further apparent from the following detailed description, which refers to the accompanying drawings which are given by way of non-limiting example, and in which.

DESCRIPTION OF THE PREFERRED EMBODIMENT

Figure 1:
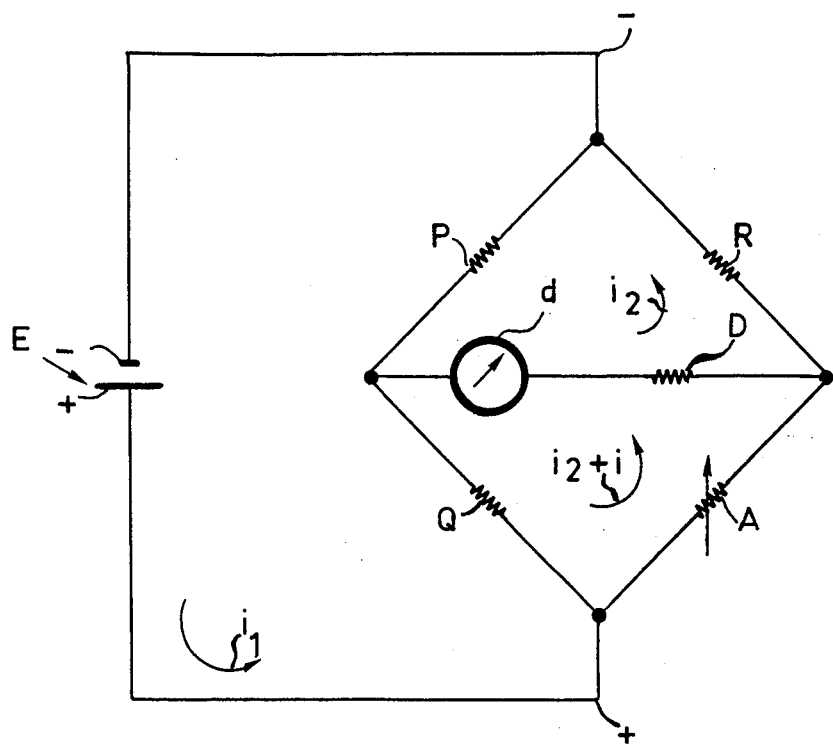
FIG. 1 shows a Wheatstone bridge which will be used to explain the principle of operation of the apparatus according to the invention.

Referring to FIG. 1, there is shown a Wheatstone bridge which will be used to explain the principle of operation of the apparatus of the invention.

The bridge shown in the Figure has two arms one of which contains two resistors P and Q in series and the other of which contains two resistors R and A, also in series. The bridge is fed by a source E of DC voltage and, in the diagonal which connects the common points of the series resistors in each arm, it contains a voltage detector $d$ whose internal resistance is indicated by D. Also shown in the Figure are the currents $i1$, $i2$ and $i2+i$ carried by the various sections of the bridge. This bridge enables, in a known way, a resistance to be measured at a given temperature. If, for example, resistor R has an unknown value at a reference temperature $t'o$, it will be possible by adjusting resistor A to balance the bridge and to detect this balance by means of voltage detector $d$.

If $R'o$ and $P'o$ are the values of resistors R and P at the reference temperature $t'o$ and if $\alpha'o$ is the temperature coefficient of these resistors of a similar type at temperature $t'o$, it can be said that:

$$R = R'o(1 + \alpha'o.t')$$

and $$P = Po(1 + \alpha'o.t')$$

If resistors Q and A have negligible temperature coefficients, it is possible to select their values so that $R'o = A.(P'o/Q)$ which, if the ratio $P'o/Q$ is called $k'o$, can be written TI $R'o = k'o.A$. (1).

If $k'o = 0.01$, then $R'o = 0.01A$, which allows the value $Ro$ of the resistor R to be easily calculated at the reference temperature.

If the resistors R and P are at the same temperature, the balance of the bridge is independent of this temperature. The value $R'o$ can be calculated from the equation (1) in which A is the known value of the variable resistor. $R'o$ thus represents the value of resistor R referred to the reference temperature $t'o$.

When fed in a particular manner, the bridge will also enable the heating up of a resistive component to be measured automatically. As will be seen, allied to this measurement of heating up is a correction for variations in ambient temperature at the place where the tests on the component are conducted. Still referring to FIG. 1, it will be assumred that:

1) R represents the resistance of a winding of a transformer or of the coil of a motor,
2) the resistor P is a resistor sensitive to variations in ambient temperature,
3) the other two resistors in the bridge have little sensitivity to temperature variations.

Applying Maxwell's theorem to the various sections of the bridge enables it to be said that the voltage $u$ of the unbalance of the bridge which is indicated by the detector $d$ is of the form:

$$u = E \cdot \frac{QR - AP}{(A + R)(P + Q)} , \qquad (2)$$

As previously, if $R'o$ and $P'o$ are the values of resistors R and P at a reference temperature $t'o$, and if $t_1$ is the value reached by the ambient temperature at the end of a test, and if $t2$ is the temperature reached by the component R, it can be said that:

$$t_1 = t'_1 + t'o$$

and $$t_2 = t'_2 + t'o$$

$t'1$ and $t'2$ representing the variations in the temperatures of resistors R and P measured from the reference temperature $t'o$.

Equation (2) then becomes $$u = E \cdot \frac{QR'o(1 + \alpha'o \cdot t'_2) - AP'o(1 + \alpha'o \cdot t'_1)}{\left[ \frac{R'o}{K'o} + R'o(1 + \alpha'o \cdot t'_2) \right] [P'o(1 + \alpha'o \cdot t'_1) + Q]}$$

or again $$u = E \cdot \frac{\alpha'o(t'_2 - t'_1)}{\frac{(k'o + 1)^2}{k'o} + (k'o + 1)\alpha'o(t'_2 + t'_1) + k'o \cdot \alpha'o^2 \cdot t'_2 \cdot t'_1}$$

from which it is possible to extract:

$$t'_2 - t'_1 = \frac{\mu}{E} \cdot \left[ \frac{1}{\alpha'o} \cdot \frac{(k'o + 1)^2}{k'o} + (k'o + 1)(t'_2 + t'_1) + k'o \cdot \alpha'o^2 \cdot t'_2 \cdot t'_1 \right] \quad (3)$$

but since $t'2 - t'1 = t2 - t1$, equation (3) does in fact represent the heating up of component R with respect to the ambient temperature, the value of which has itself changed. The voltage detector will automatically indicate this heating up if the imbalance voltage $u$ in the bridge is related to this heating up by an equation of the form:

$$t2 - t1 = 10^n \cdot \mu \quad (4),$$

$n$ being an integer which depends on the units of measurement selected for the voltage detector $d$. In cases where the voltage detector is a millivoltmeter, the number $n$ is made equal to 3. It is clear that this number could be different depending on the voltage detector and ratio $ko$ selected.

Equations (3) and (4) thus enable the following to be written:

$$E = 10^n \left[ \frac{1}{\alpha'o} \cdot \frac{(k'o + 1)^2}{k'o} + (k'o + 1)(t'_2 + t'_1) + k'o \cdot \alpha'o \cdot t'_2 \cdot t'_1 \right]$$

or again $$E = 10^n \cdot \left[ \frac{1}{\alpha'o} \cdot \frac{(k'o + 1)^2}{k'o} + (k'o + 1) u + (k'o + 1) \cdot 2t'_1 \right] \quad (5)$$

The bridge will thus automatically indicate the heating up of component R when it is supplied with a DC voltage E whose value can be calculated from equation (5).

The ratio $k'o = P'o/Q$ is, for example, made equal to 0.01 and since $\alpha'o$ is very small the last two terms of equation (5) are negligible in comparison with the first term of the equation.

This being the case, the equation can be written as:

$$E = 10^n \cdot \frac{1}{\alpha'o} \cdot \frac{(k'o + 1)^2}{k'o} \quad (6)$$

Thus, if $k'o$ is made equal to 0.01, the maximum error in measuring the heating up $t2-t1$ will be of the order of 0.5% for a component R made of copper, which is an admissible error in measuring heating up.

If the resistor is made of copper and has a temperature coefficient $\alpha o$ of 1/234.5 at a reference temperature $t'o$ equal to 0° C and if $ko = 0.01$, $n$ being equal to 3, equation (6) enables the value of E2 to be calculated from voltage E, which is equal to 23.92 volts. This being the case, resistor A is so adjusted that the voltage detector $d$ gives direct expression of the correct value of a known temperature. When so adjusted, the bridge enables variations in ambient temperature at the place where resistor R is situated to be read off directly from the detector.

Finally, the bridge is also capable of automatically indicating the heating up of component R after an operating test, whilst making allowance for variations in ambient temperature with respect to a reference temperature $t'o$ which is selected to be equal to 20° C for example.

If in equation (6), $k'o$ is replaced by its value 0.01, and $\alpha'o$ by its value at 20° C, and if $n$ is selected to be equal to 3, voltage E assumes a value E1 of 25.96 volts. It is this value of supply voltage that enables the detector to give a direct indication of the heating up $t2 - t1$ of the component R, with due allowance for variations in ambient temperature at the point of test. This being the case, the unbalanced voltage $u$ in the bridge, expressed in millivolts, automatically indicates the heating up $t2 - t1$.

Figure 2:
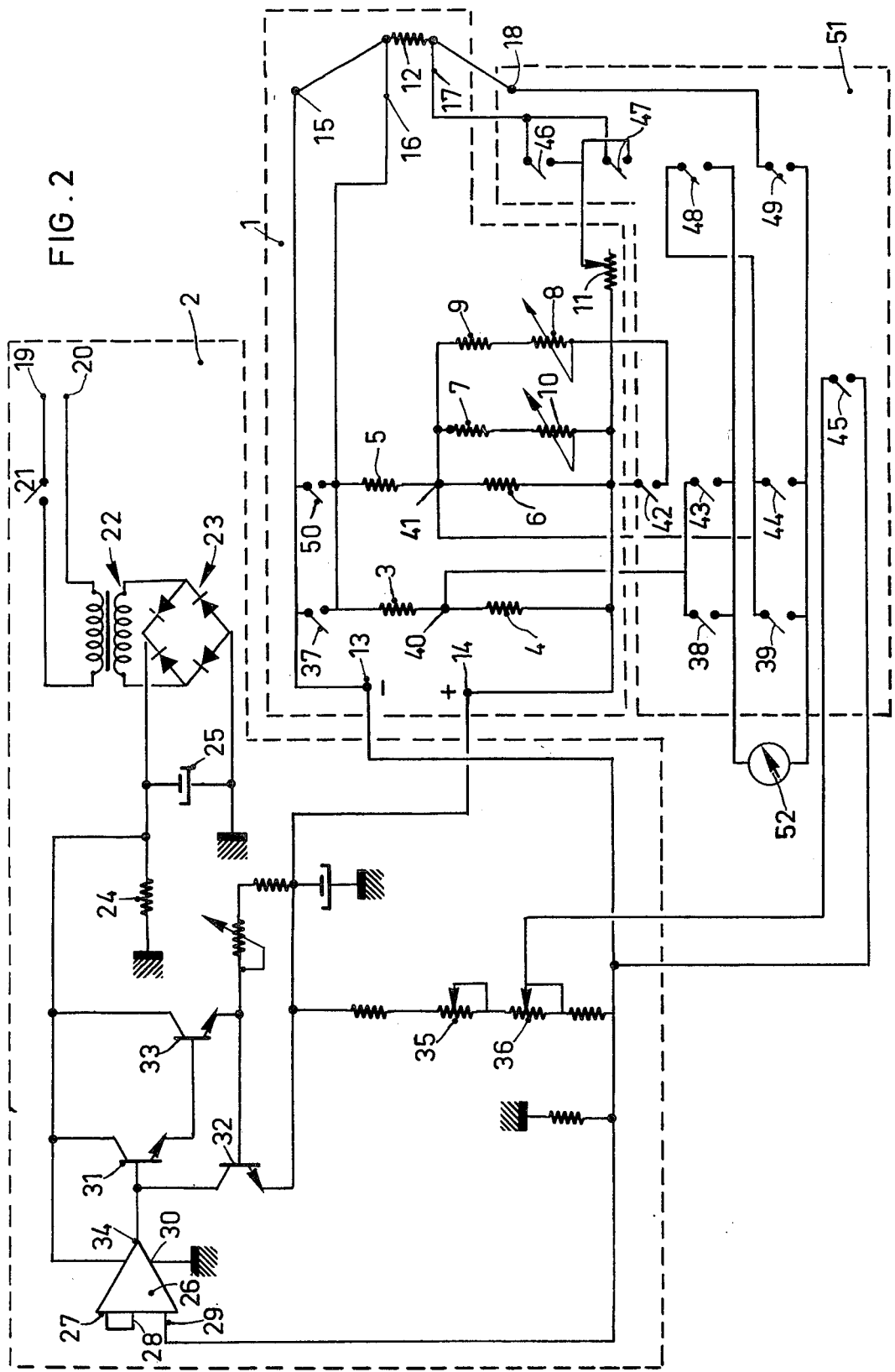
FIG. 2 shows an embodiment of the measuring apparatus of the invention.

Referring to FIG. 2, there can be seen the measuring apparatus of the invention. This apparatus consists of a bridge circuit 1, a source of DC supply voltage 2, a voltage detector 52 and a switching assembly 51. The bridge circuit is made up of three arms connected to the terminals 13, 14 of the supply source 2. The first of these arms consists of two fixed-value resistors 3 and 4 connected in series. These resistors are of fixed values, such as 100 ohms in the case of resistor 3 and 10,000 ohms in the case of resistor 4, so that the ratio between the two resistors is equal to 0.01, which figure corresponds to the value for $k'o$ given above. These resistors have little sensitivity to temperature variations.

The second arm of the bridge consists of a resistor 5 which is sensitive to variations in ambient temperature and which is connected in series with a combination consisting of a first variable resistor 10 connectable in parallel with a second variable resistor 8. Also shown in the Figure are additional resistors 6, 7, 9 which enable the bridge to be more easily adjusted. These adjustments will be described later on.

Finally, the third arm of the bridge consists of a precision resistor 11 which is connected in series, at the time when heating up is being measured, with a resistive component 12 which may for example be a winding of a transformer or a coil of a motor. This component is connected into the bridge by means of a known arrangement called a "four wire circuit" whose connecting terminals are shown at 15, 16, 17 and 18. When making measurements, a circuit of this type enables the presence of connecting wires to be avoided which, if too long, falsify the results of measurement.

The supply to the bridge is between a negative terminal 13 and a positive terminal 14 from a DC voltage source 2. This source is adjustable and, depending upon the measurements to be made, enables the bridge to be supplied with a voltage whose value may be either: E1 = 25.98 volts, or E2 = 23.92 volts, as indicated by the calculations above.

This DC voltage source is connected by its input terminals 19, 20 to the AC mains. It is switched on by means of a switch 21. A transformer 22 supplies a rectifier bridge 23 whose output contains a filter circuit formed by a resistor 24 and a capacitor 25. An operational amplifier 26, which is connected as a voltage regulator, is connected to the output of the filter circuit. The operational amplifier is of the $\omega$A723 type which is marketed in France by Messrs. Fairchild.

The non-inverting and inverting inputs 27 and 28 of the operational amplifier are connected together. These inputs set the reference level for the operational amplifier, whose comparison input is shown at 29. This amplifier is connected at 30 to the earth reference. Its output 34 is connected to a circuit consisting of three transistors 31, 32 and 33, a decoupling capacitor and various biassing resistors, which are not referenced. This circuit acts as a current limiter.

Finally, the adjustable DC voltage source includes two potentiometers 35 and 36 for adjusting the level of the output voltage from the source.

The switching assembly 51 is made up of three, combined switching means:

The first of these switching means consists of three switches 37, 38, 39 which, upon closing, will enable the voltage detector 52 to be connected between the common points 40 and 41 of the first and second arms of the bridge 1.

The second switching means are formed by switches 42, 43, 44, 45, 50. These means enable the voltage detector 52 to be connected between the common points 40 and 41 of the first and second arms of bridge 1. By the closure of switch 42, these second switching means enable the second variable resistor 8 and its additional resistor 9 to be connected in parallel with the first variable resistor 10 and its additional resistor 7.

The third switching means consist of switches 46, 47, 48 and 49. These means enable the voltage detector 52 to be connected between the common points 41 and 18 of the series resistors in the second and third arms of the bridge. The resistive component whose heating up is to be measured is then assumed to be contained in the bridge in series with the variable precision resistor 11.

The operation of the apparatus will now be described, with particular attention being given to the way in which it is adjusted by means of these various potentiometers, variable resistors and switching means and to the various automatic measurements which are the result of these adjustments.

With switches 42, 43, 44, 45 and 50 of the second switching means closed, potentiometer 36 is short-circuited and potentiometer 35 is then adjusted in such a way as to obtain the voltage E2 = 23.92V defined above across the supply terminals 13, 14 of the bridge. These switches are then opened while the switches 37, 38, 39 of the first switching means are closed in their turn. Potentiometer 36 is no longer short circuited and is adjusted to obtain the voltage E1 = 25.96V defined above across the supply terminals 13, 14 of the bridge. While the switches remain closed, the first variable resistor 10 in the second arm of the bridge is adjusted to enable the direct reading on the voltage detector 52, of a temperature equal to the ambient temperature $t1$ at the sensitive resistor 5, less the value of the reference temper $t'o$, i.e. 20° C. Thus, each time switches 37, 38 and 39 are closed, with no fresh adjustment being made, the voltage detector gives a direct indication of the difference between the ambient temperature at the place where the heating up tests are being conducted and a reference temperature which in the present case is equal to 20° C.

Switches 37, 38 and 39 are then opened and switches 42, 43, 44, 45 and 50 are closed in their turn and the bridge is then fed with a voltage E1 of 25.96 volts. The second variable resistor 8 in the bridge is then adjusted so that the voltage detector 52 gives a direct indication of the temperature $t1$ of the sensitive resistor 5. This adjustment is carried out by a comparison with the temperature indicated by a thermometer which acts as a standard. Each time the switches 31, 38, 39 of the second switching means are closed, the bridge thus gives an indication of the ambient temperature $t1$ at the place where the tests are being conducted.

Once these adjustments have been made when the apparatus is first switched on, they are not altered subsequently.

Finally, with switches 42, 43, 44, 45, 50 and 37, 38, 39 open, the component 12 whose resistance and heating up are to be measured is connected into the third arm of the bridge and the switches 46, 47, 48 and 49 of the third switching means are closed. The bridge is then fed with the voltage E1 of 25.96 volts and the reference-standard resistor 11 is adjusted in such a way that the voltage detector 52 indicates that the bridge is balanced. Because of the values of the resistors in the second and third arms of the bridge; at a state of balance the value of the resistance of the component is equal to 1/100 of the value of the precision resistor referred to the reference temperature $t'o$ which is assumed to be equal to 20° C. Then, in the course of the heating up test, when switches 46, 47, 48 and 49 are closed the voltage detector gives a direct indication in degrees centigrade of the heating up of the component under test.

The apparatus which has just been described enables the measurement of heating up of electrical components whose resistance may range from 3.5 ohms to 1200 ohms. This limitation is due to the limitation on the current which can be permitted in the precision resistor 11. It is clear that by selecting a different value of precision resistor a more extended range of measurement is possible. The apparatus does in fact also enable accurate measurements to be made of the heating up of resistive components, of temperature at the place where the tests are performed, and of the difference between this temperature and a reference temperature, and achieves this by a simple action on the part of the switching means.

It is clear that the means used in the embodiment of the apparatus of the invention could be replaced by equivalent means without departing from the scope of the invention.

It is also clear that the apparatus could be used for heating up tests on components fed with alternating current. In this case, the continuous measurement of temperature could be made by incorporating matched circuits into the bridge circuit and a capacitor into the supply to this circuit.

What is claimed is:

1. Apparatus for automatically measuring the resistance and heating up of resistive electrical components comprising a bridge circuit fed by a source of DC voltage, wherein said bridge circuit comprises:
   a first arm connected to the terminals of the voltage source and formed by two fixed-value resistors connected in series,
   a second arm connected to the terminals of the voltage source and formed by a resistor sensitive to variations in ambient temperature which is connected in series with a combination comprising a first variable resistor connectable in parallel with a second variable resistor,
   a third arm connected to the terminals of the voltage source and formed by a variable resistor connectable in series with the resistive component whose resistance and heating up are to be measured,
   a voltage detector which is connectable, on the one hand, between the common points of the series resistors in the first and second arms and, on the other hand, between the common points of the series resistors in the second and third arms, first switching means which enable the voltage detector to be connected between the common points of the resistors in the first and second arms and which enables a first level E1 of supply voltage to be applied to the bridge so that, after the said first resistor in the combination in the second arm has been adjusted, the voltage detector will indicate the difference between ambient temperature and a reference temperature, second switching means which enable the voltage detector to be connected between the common points of the resistors in the first and second arms, which enable a second level E2 of supply voltage to be applied to the bridge, and which enable the second resistor in the combination in the second arm to be connected in parallel with the first resistor in this combination so that, after the second resistor has been adjusted, the voltage detector will indicate the ambient temperature at the sensitive resistor, third switching means which enable the voltage detector to be connected between the common points of the series resistors in the second and third arms, which enable the variable resistor in the third arm to be connected in series with the resistance to be measured, and which enable the first voltage level E1 to be fed to the bridge, so that when the bridge is balanced, the value of the variable resistor is a multiple of the value of the resistance of the component to be measured and so that the voltage detector will then indicate the difference between the temperature of the component and the ambient temperature of the sensitive resistor.

2. Apparatus according to claim 1, wherein the first level E1 of supply voltage is given by the equations:

$$E_1 = 10^n \cdot \frac{1}{a_o} ; \left[ \frac{(k_o + 1)^2}{k_o} \right]$$

whilst the second level E2 of supply voltage is given by the equation:

$$E_2 = 10^n \frac{1}{a'_o} \frac{(k'_o + 1)^2}{k'_o}$$

in which equations: $n$ is an integer depending upon the units of measurement selected for the voltage detector, $a_o$ is the temperature coefficient of the sensitive resistor at 0° C, $k_o$ is the ratio between the resistors in the second arm at 0° C, $a'_o$ is the temperature coefficient at which the tests on the components are generally performed, $k'_o$ is the ratio between the resistors in the second arm at the reference temperature.

3. Apparatus according to claim 2, wherein the supply voltage E to the bridge and the units of measurement of the voltage detector are selected in such a way as to satisfy the relationship $\Delta t = 10^n \cdot U$ between the variation $\Delta t$ in the temperature of the component and the voltage U measured by the detector.

* * * * *